(12) United States Patent
Lee et al.

(10) Patent No.: US 6,447,694 B1
(45) Date of Patent: Sep. 10, 2002

(54) COMPOSITION FOR CHEMICAL MECHANICAL POLISHING

(75) Inventors: Kil Sung Lee, Seoul (KR); Seok Jin Kim, Taejon-shi (KR); Jae Seok Lee, Euiwang-shi (KR); Tu Won Chang, Taejon-shi (KR)

(73) Assignee: Cheil Industries, Inc., Kyongsang-Pukdo (KR)

( * ) Notice: Subject to any disclaimer, the term of this patent is extended or adjusted under 35 U.S.C. 154(b) by 0 days.

(21) Appl. No.: 09/598,768

(22) Filed: Jun. 22, 2000

(30) Foreign Application Priority Data

Nov. 12, 1999 (KR) ............................................. 99-50159

(51) Int. Cl.[7] ............................. C09K 13/00; C23F 1/00
(52) U.S. Cl. ........................ 252/79.1; 438/692; 510/176
(58) Field of Search .................... 252/79.1; 510/176; 438/692

(56) References Cited

U.S. PATENT DOCUMENTS

| | | | |
|---|---|---|---|
| 4,959,113 A | | 9/1990 | Roberts .................. 156/636 |
| 5,084,071 A | | 1/1992 | Nenadic et al. ............. 51/309 |
| 5,264,010 A | * | 11/1993 | Brancaleoni et al. ......... 51/308 |
| 5,354,490 A | | 10/1994 | Yu et al. .................. 252/79.1 |
| 5,516,346 A | | 5/1996 | Cadien et al. .............. 51/308 |
| 5,728,308 A | * | 3/1998 | Muroyama .................. 216/88 |
| 5,858,813 A | * | 1/1999 | Scherber et al. ........... 438/693 |
| 6,027,554 A | * | 2/2000 | Kodama et al. .............. 106/3 |

FOREIGN PATENT DOCUMENTS

| | | |
|---|---|---|
| EP | 0 786 504 A2 | 2/1997 |
| EP | 0 816 457 A2 | 1/1998 |
| WO | WO 97/13889 | 4/1997 |
| WO | WO 97/40030 | 10/1997 |

* cited by examiner

Primary Examiner—Robert Kunemund
Assistant Examiner—Lynette T. Umez-Eronini
(74) Attorney, Agent, or Firm—Blank Rome Comiskey & McCauley LLP

(57) ABSTRACT

Disclosed is a polishing composition which comprises an $Al_2O_3/SiO_2$ composite-based metal oxide powder, deionized water and an additive, said metal oxide powder comprising an $Al_2O_3/SiO_2$ composite as an essential component. The polishing composition is superior in removal rate and free of causing microscratches after polishing and thus, suitable for use in the global planarization of device wafer surfaces.

12 Claims, No Drawings

COMPOSITION FOR CHEMICAL MECHANICAL POLISHING

BACKGROUND OF THE INVENTION

1. Field of the Invention

The present invention relates to a polishing composition which can be used in the semiconductor industry. More particularly, the present invention relates to use of $Al_2O_3/SiO_2$ composite particles as an essential abrasive so as to improve the removal rate without causing microscratches.

2. Description of the Prior Art

Nowadays, the increase in the density of integrated circuits makes their producers aware of the importance of the global planarization of wafers. Under the circumstance, intensive and extensive attention has been given to CMP (Chemical Mechanical Polishing) as a planarization method.

Typically, highly integrated semiconductor devices are manufactured by alternately depositing conducting materials and insulating materials and thus forming patterns. If a surface is not flat, it is very difficult to form a new pattern on the surface. To highly integrate semiconductor devices, it is required to minimize feature sizes and to perform multi-level interconnections. Global planarization is one of the most important prerequisites to achieve this.

As the structures of microprocessors and DRAMs become multileveled, for instance, as the metal layer for the third generation version of 64 MDRAM becomes of a triply structure, problems may occur owing to the process complexity if the films are deposited onto the layers which are not flat. Particularly as for the photolithography process, when it is carried out over a non-planar layer, an incident light will reflect diffusely, which will result in an imprecise photoresist pattern. Thus, there remains a need to make the structure between layers simpler. For this, the surface is planarized by polishing unnecessarily deposited parts thereon, so as to effectively deposit more film layers.

Of the planarization methods ever known, CMP is the most effective. The other planarization methods which have been developed thus far, such as SOG/Etch Back/ECR Depo & Etch, are very complicated in process procedure, requiring 2–5 process steps, but the CMP process can be finished simply by polishing and cleaning.

Conventional polishing compositions or slurries for use in semiconductor CMP processes commonly comprise metallic oxide. According to the materials to be polished, the conventional polishing compositions or slurries can be largely classified into three kinds: polishing compositions for monosilicon, for insulating layers, and for metal lines and plugs.

Abrasives which are most extensively used in the semiconductor CMP process are silica ($SiO_2$), alumina ($Al_2O_3$), ceria ($CeO_2$), zirconia ($ZrO_2$), and titania ($TiO_2$), which can be produced by a fuming or a sol-gel method, as described in U.S. Pat. Nos. 4,959,113, 5,354,490, and 5,516,346 and WO 97/40,030. There has recently been reported a composition or a slurry comprising mangania ($Mn_2O_3$) (European Pat. No. 816,457) or a silicon nitride (SiN) (European Pat. No. 786,504). These metal oxides are independently used in the patent references and determine the properties and performance of their polishing slurries. With a relatively unstable dispersed state under an acidic condition, for example, a polishing slurry comprising silica causes less microscratches compared with a polishing slurry comprising alumina, but shows a low removal rate against barrier material when being applied as a metal slurry. On the other hand, a polishing slurry comprising alumina is advantageous in terms of being more stable in a dispersed state compared with a polishing slurry comprising silica and high in the removal rate against barrier materials, but suffers from a serious disadvantage of causing a quantity of microscratches after polishing.

Improved as they are to some extent in physical properties and polishing performance, recently developed polishing slurries comprising ceria, zirconia, titania, mangania or silicon nitride have not yet been stably established in the production processes on a commercial scale and are expensive compared with ones comprising silica or alumina.

Also, there have been reported attempts to use two or more metal oxides in combination with the aim of improving polishing performances. For example, U.S. Pat. No. 5,084,071 discloses that the presence of alumina ($Al_2O_3$) particles brings the slurry comprising silica as a main abrasive to an improved level of polishing reproductivity. Another combined polishing slurry can be referred to WO 97/13889, which discloses the uses of alumina (a type) in combination with a relatively soft metal oxide. Such composite polishing slurries exhibit better results in removal rate and selectivity than do the polishing slurries comprising single metal oxides, but have much to be improved. For example, when a great quantity of alumina (a type) coexists with a small quantity of silica in a polishing slurry, the oxide particles are in a simple mixed state so that poor dispersion stability appears on the slurry, giving rise to particle coagulation during storage. In result, the polishing slurry suffers sedimentation.

SUMMARY OF THE INVENTION

Leading to the present invention, the intensive and thorough research on a polishing composition, repeated by the present inventors, resulted in the finding that fine $Al_2O_3/SiO_2$ composite particles increase a removal rate on semiconductor wafers as well as are superior in polishing selectivity without causing microscratches after polishing.

Therefore, it is an object of the present invention to overcome the above problems encountered in prior arts and to provide a polishing composition which is superior in removal rate and polishing selectivity and free of causing microscratches.

In accordance with the present invention, there is provided a polishing composition comprising fine $Al_2O_3/SiO_2$ composite-based metal oxide particles, deionized water and additives.

The polishing composition of the present invention is suitable for use in polishing various industrial products, including semiconductors, photomasks, glassdiscs, and synthetic resins, especially, in surface planarization of device wafers. In detail, with superiority in removal rate and polishing selectivity for thin films and low incidence of microscratches after polishing, the polishing composition of the present invention can find numerous applications in CMP fields, especially in highly integrated device fabrication fields, including the polishing of silicon, interlayer insulating films, metal lines and plug, and barrier materials.

DETAILED DESCRIPTION OF THE PREFERRED EMBODIMENTS

The present invention contemplates use of an $Al_2O_3/SiO_2$ composite as an essential metal oxide ingredient of a CMP composition suitable for use in fabricating semiconductor devices.

The $Al_2O_3/SiO_2$ composite, a feature of the present invention, can be prepared from $AlCl_3$ and $SiCl_4$ by a Co-Fuming method as follows:

$$AlCl_3 + SiCl_4 \xrightarrow[\text{Heat } (\geq 1000° \text{ C.})]{\text{air}} Al_2O_3/SiO_2 + HCl.$$

The metal oxide particles thus obtained are not in a simple mixed state of $Al_2O_3$ and $SiO_2$, but in a composite state in which $Al_2O_3$ is linked to $SiO_2$. The composite shows characteristic phisycal properties which are quite different from a simple mixture of the two components. Physical properties of the $Al_2O_3/SiO_2$ composite based on 'VP MOX 90', a brand name of Degussa, Germany, are summarized in Table 1, below.

TABLE 1

Physical properties of $Al_2O_3/SiO_2$ (based on VP MOX 90)

| | |
|---|---|
| Specific Surface Area (BET) | 100 ± 25 m²/g |
| pH | >3.8 |
| Isoelectric Point | 6~7 |
| $Al_2O_3$ Content | 67 ± 15 wt % |
| $SiO_2$ Content | 33 ± 15 wt % |
| Bulk density | 60~100 g/l |
| Cl Content | <0.5 wt % |

The contents of each component in the composite can be controlled depending on fed amount and reaction condition. In a typical Co-Fuming method, a composite comprising 67±15 wt % of $Al_2O_3$ and 33±15 wt % of $SiO_2$ is obtained, which is preferable for the present invention.

Any of the conventional dispersion methods, such as high speed milling with a dyno-mill or ball mill and use of a high shear mixer, is available to prepare a dispersion of $Al_2O_3/SiO_2$ for use in a polishing composition. More efficient than conventional methods is the method using a microfluidizer, disclosed in Korean Pat. Appl'n No. 98-39212 filed by the present inventors.

For use in a polishing dispersion slurry, the $Al_2O_3/SiO_2$ composite is in primary particle size between 10 and 100 nm and preferably between 20 and 60 nm as measured in BET. For example, when the primary particle size is smaller than 10 nm, a sharp decrease occures in the removal rate, deteriorating the throughput. On the other hand, when the primary particle size is larger than 100 nm, an increased removal rate is obtained, but difficulty is imposed on the dispersion of the particles. What is worse, a quantity of large particles are feasible to cause a significant quantity of microscratches.

The metal oxides in an aqueous dispersion form secondary particles, which preferably range, in mean size, from 10 to 500 nm. Particles larger than 500 nm in size negatively affect the dispersion stability such that the aqueous dispersion suffers sedimentation after being allowed for stand for one week at room temperature. Thus, a stirring process is additionally conducted just before a CMP process.

To be used in the dispersion slurry, the $Al_2O_3/SiO_2$ composite of the present invention also should meet a specific surface area requirement which is in the range of 20–200 m²/g.

As for the solid content of the $Al_2O_3/SiO_2$, it is on the order of 1–50% by weight based on the total weight of the polishing composition and preferably on the order of 1–25% by weight. For example, if the solid content of $Al_2O_3/SiO_2$ is below 1% by weight, desired effects cannot be obtained. The solid content of $Al_2O_3/SiO_2$ may be further confined to a narrower range depending on the surfaces to be polished. When applied in a CMP process for semiconductor device fabrication, the polishing composition using the $Al_2O_3/SiO_2$ as a main abrasive more preferably has a solid content of 1–5% by weight for monosilicon, 5–15% by weight for interlayer insulating films, and 3–7% by weight for metal lines, plugs, and barrier materials.

In accordance with the present invention, the polishing dispersion may be further supplemented with additives depending on the substrates to be polished. For instance, the dispersion may be added with bases such as KOH for polishing monosilicons and interlayer insulating films and with oxidizing agents or other appropriate agents for polishing metal surface such as W and Cu, and barrier materials such as Ti/TiN and Ta/TaN. Examples of available bases include KOH, $NH_4OH$, and $R_4NOH$. Acids also can be added, which can be exemplified by $H_3PO_4$, $CH_3COOH$, HCl, HF and so on. Available as such supplementary oxidizing agents are $H_2O_2$, $KIO_3$, $HNO_3$, $H_3PO_4$, $K_2Fe(CN)_6$, $Na_2Cr_2O_7$, KOCl, $Fe(NO_3)_2$, $NH_2OH$, and DMSO. Divalent acids, such as oxalic acid, malonic acid and succinic acid can be used as additives for the polishing composition of the present invention. In order to improve polishing selectivity for metal surfaces, potassium hydrogen phthalate may be used. 2-pyrrolidinone may be added to enhance a moisturizing effect, thereby preventing the aggregation and agglomeration of the abrasive particles. These additives may be used alone or in combination. The addition order of the additives is not particularly limited. They may be added before or after the dispersion of the $Al_2O_3/SiO_2$ composite in deionized water. Preferably, the polishing composition of the present invention is essentially composed, by weight, of 1–50% of the $Al_2O_3/SiO_2$ composite, 1–10% of the additives, and 40–98% of deionized water.

As described above, the present invention is directed to a polishing composition comprising fine $Al_2O_3/SiO_2$ composite particles, which can polish semiconductor wafers at high removal rates and show high selectivity for interlayer insulating films ($SiO_2$) without causing microscratches after polishing. Therefore, the present invention can be applied to the fabrication of highly integrated devices, such as shallow trench isolation (STI) processes.

EXAMPLE

Preparation of $Al_2O_3/SiO_2$ Composite Dispersion Slurry

In a 20 liter polyethylene vessel, 1.3 kg of $Al_2O_3/SiO_2$ composite powder, such as that manufactured by Degussa, Germany, identified as VP MOX 90 and 8.6 kg of deionized water were pre-mixed at 1,000 rpm for 2 hours. The mixture was allowed to pass once through a dispersion chamber which was maintained at a pressure pulsation in a range of 18,000±1800 psi. After being filtered through a 5 μm depth filter, the sample thus dispersed was found to be 10–400 nm in particle size distribution and 180 nm in mean particle size as measured by a grain size analyzer, such as that manufactured by Malvern, identified as Zetasizer.

Example I

Five liters of the $Al_2O_3/SiO_2$ composite dispersion prepared above was adjusted to 11.0 in pH by the addition of an appropriate amount of a 20%-KOH solution. Under the following polishing conditions, this polishing composition was used to polish a six-inch monosilicon wafer for two minutes. The removal rate and WIWNU (Within Wafer Non-Uniformity) were evaluated from the thickness of the sample left. The number of microscratches was measured by a wafer defect inspection system (KLA TENCOR).

Polishing Conditions

Polisher: 6EC (Strasbaugh)

Conditions

Pad type: IC100/Suba IV Stacked (Rodel)
    Platen Speed: 90 rpm
    Quill Speed: 30 rpm
    Pressure: 8 psi
    Back Pressure: 0 psi
    Temp.: 25° C.
    Slurry Flow: 150 ml/min.

Polishing Results

| Substrate | Si |
|---|---|
| Removal Rate (Å/min) | 4,250 |
| Nos. of microscratches generated | 2 |
| WIWNU (%) | 2.30 |

*WIWNU= (standard deviation/mean removal rate) × 100

Example II

The same procedure as in Example I was repeated, except that an interlayer insulating film ($SiO_2$) and an SiN film were independently used instead of the monosilicon substrate.

Polishing Results

| Substrate | $SiO_2$ | SiN |
|---|---|---|
| Removal Rate (Å/min) | 5,775 | 345 |
| Nos. of microscratches generated | 0 | 0 |
| WIWNU (%) | 2.45 | 3.21 |

Example III

Five liters of the $Al_2O_3/SiO_2$ composite dispersion slurry prepared above was diluted with five liters of deionized water to control the solid content into 6.5% by weight, and the dispersion was adjusted to 3 in pH by the addition of 0.4 liters of 50%-$H_2O_2$ as an oxidizing agent and then with $H_2SO_4$ and $HNO_3$. Using six-inch wafers on which W and $SiO_2$ were respectively deposited, the polishing performance of the polishing composition was evaluated as in Example I.

Polishing Results

| Substrate | W | $SiO_2$ |
|---|---|---|
| Removal Rate (Å/min) | 3,450 | 24 |
| Nos. of microscratches generated | 1 | 0 |
| WIWNU (%) | 3.45 | 2.3 |

Example IV

Five liters of the $Al_2O_3/SiO_2$ composite dispersion slurry prepared above was diluted with five liters of deionized water to control the solid content into 6.5% by weight, and the dispersion was adjusted to 6.5 in pH by the addition of 0.4 liters of 50%-$H_2O_2$ as an oxidizing agent and then with $H_2SO_4$, $HNO_3$ and ammonia. Using six-inch wafers on which Cu and $SiO_2$ were respectively deposited, the polishing performance of the polishing composition was evaluated as in Example I.

Polishing Results

| Substrate | Cu | $SiO_2$ |
|---|---|---|
| Removal Rate (Å/min) | 4,370 | 12 |
| Nos. of microscratches generated | 0 | 0 |
| WIWNU (%) | 2.35 | 2.10 |

Comparative Examples I to III

Polishing slurries were prepared and evaluated for polishing performance in the same manner as in Example I, except that the following metal oxide materials were used instead of the $Al_2O_3/SiO_2$ composite dispersion.

$Al_2O_3$ dispersion slurry: particle size distribution 10–720 nm, mean size: 255 nm $SiO_2$ dispersion slurry: particle size distribution 10–400 nm, mean size: 175 nm $CeO_2$ dispersion slurry: particle size distribution 10–1100 nm, mean size: 450 nm Polishing Results

| Nos. of C. Examples | Metal Oxide | Removal Rate (Å/min) | No. of microscratch | WIWNU (%) |
|---|---|---|---|---|
| I | $Al_2O_3$ | 3,500 | 280 | 5.85 |
| II | $SiO_2$ | 1,340 | 16 | 5.10 |
| III | $CeO_2$ | 5,150 | 35 | 5.00 |

Comparative Examples IV to VI

Polishing slurries were prepared and evaluated for polishing performance in the same manner as in Example II, except that the following metal oxide materials were used instead of the $Al_2O_3/SiO_2$ composite dispersion.

Polishing Results

| Nos. of C. Examples | Substrates | Metal Oxide | Removal Rate (Å/min) | No. of microscratch | WIWNU (%) |
|---|---|---|---|---|---|
| IV | $SiO_2$ | $Al_2O_3$ | 5,315 | 370 | 4.45 |
|  | SiN |  | 1,105 | 12 | 4.50 |
| V | $SiO_2$ | $SiO_2$ | 3,980 | 39 | 3.90 |
|  | SiN |  | 870 | 8 | 4.00 |
| VI | $SiO_2$ | $CeO_2$ | 6,263 | 87 | 4.35 |
|  | SiN |  | 410 | 5 | 4.10 |

Comparative Examples VII to IX

Polishing slurries were prepared and evaluated for polishing performance in the same manner as in Example III, except that the following metal oxide materials were used instead of the $Al_2O_3/SiO_2$ composite dispersion.

Polishing Results

| Nos. of C. Examples | Substrates | Metal Oxide | Removal Rate (Å/min) | No. of microscratch | WIWNU (%) |
|---|---|---|---|---|---|
| VII | W | $Al_2O_3$ | 3,104 | 178 | 4.55 |
|  | $SiO_2$ |  | 650 | 58 | 3.45 |
| VIII | W | $SiO_2$ | 2,960 | 12 | 3.25 |
|  | $SiO_2$ |  | 45 | 3 | 5.25 |
| IX | W | $CeO_2$ | 3,826 | 60 | 3.50 |
|  | $SiO_2$ |  | 1,205 | 15 | 3.45 |

Comparative Examples X to XII

Polishing slurries were prepared and evaluated for polishing performance in the same manner as in Example IV, except that the following metal oxide materials were used instead of the $Al_2O_3/SiO_2$ composite dispersion.

| Nos. of C. Examples | Substrates | Metal Oxide | Removal Rate (Å/min) | No. of microscratch | WIWNU (%) |
|---|---|---|---|---|---|
| X | Cu | $Al_2O_3$ | 4,360 | 370 | 3.45 |
|  | $SiO_2$ |  | 350 | 240 | 5.10 |
| XI | Cu | $SiO_2$ | 3,960 | 35 | 4.25 |
|  | $SiO_2$ |  | 275 | 10 | 4.20 |
| XII | Cu | $CeO_2$ | 4,844 | 56 | 3.23 |
|  | $SiO_2$ |  | 1,250 | 35 | 3.45 |

As described hereinbefore, the polishing composition of the present invention is superior in removal rate and free of causing microscratches after polishing and suitable for use in the global planarization of device wafer surfaces.

What is claimed is:

1. A polishing composition, comprising an $Al_2O_3/SiO_2$ composite-based metal oxide powder, deionized water and an additive, wherein said metal oxide powder comprises an $Al_2O_3/SiO_2$ composite as an essential component, wherein said $Al_2O_3/SiO_2$ composite metal oxide powder is present at an amount of 1–25% by weight based on the total weight of the composition.

2. The polishing composition as set forth in claim 1, wherein said $Al_2O_3/SiO_2$ composite is prepared from $AlCl_3$ and $SiCl_4$ by a Co-Fuming method.

3. The polishing composition as set forth in claim 1, wherein said $Al_2O_3/SiO_2$ composite metal oxide powder contains 67±15 wt % of $Al_2O_3$ and 33±15 wt % Of $SiO_2$.

4. The polishing composition as set forth in claim 1, wherein said $Al_2O_3/SiO_2$ composite metal oxide powder ranges, in specific surface area, from 20 to 200 m²/g.

5. The polishing composition as set forth in claim 1, wherein said $Al_2O_3/SiO_2$ composite has a particle size of 10–500 nm when being in a dispersed state.

6. The polishing composition as set forth in claim 1, wherein said $Al_2O_3/SiO_2$ composite metal oxide powder comprises an $Al_2O_3/SiO_2$ composite alone or in combination with at least one metal oxide selected from the group consisting of silica, alumina, ceria, zirconia and titania.

7. The polishing composition as set forth in claim 1, wherein said additive is selected from the group consisting of KOH, $NH_4OH$, $R_4NOH$, $H_3PO_4$, $CH_3COOH$, HCl, HF, $H_2O_2$, $KIO_3$, $HNO_3$, $H_3PO_4$, $K_2Fe(CN)_6$, $Na_2Cr_2O_7$, KOCl, $Fe(NO_3)_2$, $NH_2OH$, DMSO, oxalic acid, malonic acid, succinic acid, potassium hydrogen phthalate, 2-pyrrolidinone and mixtures thereof.

8. A chemical mechanical polishing composition for semiconductor devices, comprising 1–25% by weight of a metal oxide powder comprising an $Al_2O_3/SiO_2$ composite as an essential component, 65–98% weight of deionized water, and 1–10% by weight of an addituve.

9. The polishing composition as set forth in claim 8, wherein said semiconductor device comprises a wafer thin film made of a material selected from the group consisting of Si, $SiO_2$, SiN, W, Ti, TiN, Cu, and TaN.

10. The polishing composition as set forth in claim 8, wherein said semiconductor devices are fabricated in a shallow trench isolation process.

11. The polishing composition as set forth in claim 1 wherein said composite metal oxide powder is formed by co-fuming.

12. The polishing composition as set forth in claim 8 wherein said composite metal oxide powder is formed by co-fuming.

* * * * *